(12) United States Patent
Ribeiro et al.

(10) Patent No.: US 12,416,699 B2
(45) Date of Patent: Sep. 16, 2025

(54) TRANSFORMER MONITORING APPARATUS

(71) Applicant: UBICQUIA, INC., Fort Lauderdale, FL (US)

(72) Inventors: Claudio Santiago Ribeiro, Evanston, IL (US); Elliott Earl Murray, Plantation, FL (US); Patrick Stuart Claeys, Weston, FL (US)

( * ) Notice: Subject to any disclaimer, the term of this patent is extended or adjusted under 35 U.S.C. 154(b) by 216 days.

(21) Appl. No.: 18/200,554

(22) Filed: May 22, 2023

(65) Prior Publication Data

US 2023/0296713 A1    Sep. 21, 2023

Related U.S. Application Data

(63) Continuation-in-part of application No. 29/830,655, filed on Mar. 14, 2022, now Pat. No. Des. 1,006,763.

(Continued)

(51) Int. Cl.
*G01R 35/02* (2006.01)
*G01R 31/62* (2020.01)

(52) U.S. Cl.
CPC ............. *G01R 35/02* (2013.01); *G01R 31/62* (2020.01)

(58) Field of Classification Search
CPC ........ G01R 35/00; G01R 31/00; G01R 31/50; G01R 35/02; G01R 31/62

(Continued)

(56) References Cited

U.S. PATENT DOCUMENTS 4,727,316 A * 2/1988 Shen .................... G01R 33/025
336/84 C
2005/0167140 A1    8/2005 Caveney
(Continued)

FOREIGN PATENT DOCUMENTS

| CN | 111289938 A * | 6/2020 | ............. G01R 35/02 |
| EP | 3516406 B1 | 7/2020 | |
| EP | 4485780 A1 * | 1/2025 | .......... H02M 3/3353 |

OTHER PUBLICATIONS

U.S. Patent & Trademark Office as International Searching Authority, International Search Report issued in connection with counterpart International Application No. PCT/US2023/023183, Oct. 3, 2023, 4 pages.

(Continued)

*Primary Examiner* — Hoai-An D. Nguyen
(74) *Attorney, Agent, or Firm* — Daniel C. Crilly (57) ABSTRACT

A transformer monitor includes a housing and at least two connectors. The housing has a first end and a second end opposite the first end. A first connector is positioned proximate the housing's first end and configured for connection to a first cable assembly that outputs signals representative of a primary input current to the transformer. A second connector is positioned proximate the housing's second end and configured for connection to a second cable assembly that outputs signals representative of a secondary output current of the transformer. The connectors are oriented such that the first cable assembly extends away from the housing's first end in a first direction when the cable assembly is connected to the first connector and the second cable assembly extends away from the housing's second end in a second direction generally opposite to the first direction when the cable assembly is connected to the second connector.

20 Claims, 8 Drawing Sheets

Related U.S. Application Data

(60) Provisional application No. 63/344,992, filed on May 23, 2022.

(58) Field of Classification Search
USPC .................................................. 324/600, 726
See application file for complete search history.

(56) References Cited

U.S. PATENT DOCUMENTS

2021/0373087 A1   12/2021   Katz
2022/0148800 A1   5/2022    Hutson et al.

OTHER PUBLICATIONS

U.S. Patent & Trademark Office as International Searching Authority, Written Opinion of the International Searching Authority in connection with counterpart International Application No. PCT/US2023/023183, Oct. 3, 2023, 6 pages.

* cited by examiner

TRANSFORMER MONITORING APPARATUS

CROSS-REFERENCE TO RELATED APPLICATIONS

The present application is a continuation-in-part of U.S. Design patent application Ser. No. 29/830,655, which was filed on Mar. 14, 2022, and is incorporated herein by this reference as if fully set forth herein. Additionally, the present application claims the benefit of and priority upon U.S. Provisional Patent Application No. 63/344,992, which was filed on May 23, 2022, and is incorporated herein by this reference as if fully set forth herein.

TECHNICAL FIELD

The present disclosure relates generally to electrical utility monitoring equipment, and, more particularly, to a transformer monitoring apparatus that is configured to sense current on both the primary and secondary sides of a transformer while mitigating interference or crosstalk between current sensing cable assemblies.

BACKGROUND

Electrical utility transformers are used extensively for converting distribution voltage levels down to service levels that are provided to end customers. Transformers are commonly provided as pole-mounted units on utility poles and as pad mounted units where electrical utility lines are underground. Transformers are subject to failures, which then cause service outage for customers being serviced by the transformer.

Oftentimes, a utility may not know when a transformer has failed until an outage is reported. Accordingly, there is a need for a utility to be able to monitor its distribution transformers to identify problems before they cause an outage, as well as to identify when an outage has occurred. To accurately assess the condition or health of a transformer, parameter data associated with the primary and secondary sides of the transformer are needed. However, the accuracy of such data may be negatively impacted due to interference or crosstalk between cable assemblies used to provide output signals associated with the primary and secondary sides of the transformer.

SUMMARY

According to one exemplary embodiment of the present disclosure, a monitoring apparatus for a transformer includes a housing and at least two connectors. The housing has a first end and a second end, where the second end is generally opposite the first end. The two ends may be lengthwise ends, widthwise ends, or angular ends. The housing may also have multiple faces or surfaces on a front side thereof, which may be on different planes. A first one of the connectors is positioned proximate the first end of the housing and configured for connection to a first cable assembly that outputs signals representative of at least one primary input current to the transformer. A second one of the connectors is positioned proximate the second end of the housing and configured for connection to a second cable assembly that outputs signals representative of at least one secondary output current of the transformer. The first connector and the second connector are oriented such that the first cable assembly extends away from the first end of housing in a first direction when the first cable assembly is connected to the first connector and the second cable assembly extends away from the second end of the housing in a second direction when the second cable assembly is connected to the second connector, and wherein the first direction and the second direction are generally opposite directions.

According to another exemplary embodiment of the present disclosure, the first connector is oriented at an angle of not more than forty-five degrees relative to a reference plane running a length of the housing, and the second connector is oriented at an angle of not less than one hundred thirty-five degrees relative to the reference plane. Alternatively, the second connector is oriented at an angle of not more than forty-five degrees relative to a reference plane running a length of the housing, and the first connector is oriented at an angle of not less than one hundred thirty-five degrees relative to the reference plane. Further alternatively, the first connector and the second connector may be oriented so as to be at an angle in a range of about ninety degrees to about one hundred eighty degrees relative to each other.

According to another exemplary embodiment of the present disclosure, each of the first connector and the second connector may include a respective connector component that extends outward from the housing. Alternatively or additionally, the first cable assembly may output signals representative of at least two primary input currents to the transformer and/or the second cable assembly may output signals representative of at least two secondary output currents of the transformer. Further alternatively or additionally, the first connector and the second connector may be coaxial connectors. Still further, where the housing has a front side and a back side, the first connector and the second connector may be positioned on the front side of the housing.

According to another exemplary embodiment of the present disclosure, the housing may include a base on a back side thereof, wherein the base defines a cavity. In this embodiment, the monitoring apparatus may further include a pressure sensor connector and an antenna connector positioned in the cavity. Additionally, a wall of the base may define at least two cutouts to allow for passage of an antenna cable to the antenna connector and a pressure sensor cable to the pressure sensor connector.

According to a further exemplary embodiment of the present disclosure, the monitoring apparatus may additionally include a third connector positioned proximate the second end of the housing. In such a case, the third connector may be configured for connection to a third cable assembly that outputs alternating current (AC) power for use by the monitoring apparatus. Alternatively or additionally, the third connector may be oriented substantially parallel to the second connector.

According to yet another exemplary embodiment of the present disclosure, a monitoring apparatus for a transformer includes a housing and at least three connectors. According to this embodiment, the housing has a front side, a back side, a first lengthwise end, and a second lengthwise end, where the second lengthwise end is substantially opposite the first lengthwise end. A first one of the connectors is positioned on the front side of the housing proximate the first lengthwise end and configured for connection to a first cable assembly that outputs signals representative of at least one primary input current to the transformer. A second one of the connectors is positioned on the front side of the housing proximate the second lengthwise end and configured for connection to a second cable assembly that outputs signals representative of at least one secondary output current of the transformer. A third one of the connectors is positioned on the front side of the housing proximate the second lengthwise end and configured for connection to a third cable assembly that outputs AC power for use by the monitoring apparatus. In this embodiment, the first connector and the second connector are oriented such that the first cable assembly extends away from the first end of housing in a first direction when the first cable assembly is connected to the first connector, the second cable assembly extends away from the second end of the housing in a second direction when the second cable assembly is connected to the second connector, and the first connector and the second connector are oriented so as to be at an angle in a range of about ninety degrees to about one hundred eighty degrees relative to each other.

Positioning the connectors for the current sensing cable assemblies on different faces or at different ends of the monitoring apparatus mitigates the likelihood that the primary side and secondary side current sensing cable assemblies will cross each other, which could cause errors in the primary side and/or secondary side current data computed by a processor based on outputs of the cable assemblies.

Although the present disclosure illustrates and describes a transformer monitoring apparatus, it is nevertheless not intended to be limited to the details shown because various modifications and structural changes may be made therein without departing from the spirit of the disclosure and while remaining within the scope and range of equivalents of the claims. Additionally, well-known elements of the invention will not be described in detail or will be omitted so as not to obscure the relevant details of the invention.

Features that are considered characteristic of the invention are set forth in the appended claims. As required, detailed embodiments of the transformer monitoring apparatus are disclosed herein; however, it is to be understood that the disclosed embodiments are merely exemplary, and the transformer monitoring apparatus may be embodied in various forms. Therefore, specific structural and functional details disclosed herein are not to be interpreted as limiting, but merely as a basis for the claims and as a representative basis for teaching one of ordinary skill in the art to variously employ the claimed invention in appropriately detailed structures. Further, the terms and phrases used herein are not intended to be limiting; but rather provide an understandable description of the disclosure. While the specification concludes with claims defining the features of the invention, it is believed that the claimed invention will be better understood from a consideration of the following description in conjunction with the drawing figures, in which like reference numerals are carried forward. The figures of the drawings are not drawn to scale.

The terminology used herein is for the purpose of describing particular embodiments only and is not intended to be limiting. The terms "a" or "an," as used herein, are defined as one or more than one. The term "plurality," as used herein, is defined as two or more. The term "another," as used herein, is defined as at least a second or more. The terms "including" and/or "having," as used herein mean "included, but not limited to." The term "providing" is defined herein in its broadest sense (e.g., bringing/coming into physical existence, making available, and/or supplying to someone or something, in whole or in multiple parts at once or over a period of time).

As used in this description, unless otherwise specified, azimuth or positional relationships indicated by terms such as "up", "down", "left", "right", "inside", "outside", "front", "back", "head", "tail" and so on, are azimuth or positional relationships based on the drawings, which are only to facilitate description of the embodiments of the present disclosure and simplify the description, but not to indicate or imply that the devices or components must have a specific azimuth, or be constructed or operated in the specific azimuth, which thus cannot be understood as a limitation to the embodiments of the present disclosure or the appended claims. Furthermore, terms such as "first", "second", "third" and so on are only used for identification purposes and are not to be construed as indicating or implying relative importance.

As used in this description, unless otherwise clearly defined and limited, terms such as "installed", "coupled", and "connected" should be broadly interpreted, for example, to mean fixedly connected, detachably connected, integrally connected; mechanically connected, electrically connected; directly connected or indirectly connected via an intermediate medium.

In the absence of any specific clarification related to its express use in a particular context, where the terms "substantially," "approximately," "generally," or "about" are used as modifiers in the present disclosure and any appended claims (e.g., to modify a structure, a dimension, a measurement, a direction, an orientation, or any other characteristic), it is understood that the characteristic may vary by up to thirty percent. In these cases, a device that is mounted exactly orthogonal is mounted along a "Y" axis and a "X" axis that is normal (i.e., 90 degrees or at right angle) to a plane or line formed by a "Z" axis. Different from the exact precision of the term "orthogonal," the use of "substantially" or "about" to modify the characteristic permits a variance of the particular characteristic by up to thirty percent or such other amount as may be required by the context of the applicable description. As another example, an element or component that is oriented exactly opposite to another element or component is oriented one hundred eighty degrees from the other element or component. Different from the exact precision of the term "opposite," the use of "substantially" or "generally" to modify the orientation or direction permits a variance thereof by up to thirty percent (e.g., up to fifty-four degrees) or such other amount as may be stated in the applicable description or required by the context of the applicable description. Alternatively, these terms may refer to a range of numbers or quantities that one of skill in the art would consider equivalent to the recited values (i.e., having the same function or result). In many instances, these terms may include numbers that are rounded to the nearest significant figure.

In the present disclosure, the term "longitudinal" or "lengthwise" means in a direction corresponding to an elongated direction of the device. Those skilled in the art will understand the specific meanings of the above-mentioned terms and others in the embodiments of the present disclosure according to the described context, examples, and circumstances.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present disclosure.

DETAILED DESCRIPTION

In order to address problems associated with using a field-retrofittable monitor to accurately detect primary current(s) into and secondary current(s) out of a utility transformer, a transformer monitoring unit or apparatus is disclosed in accordance with several exemplary embodiments. The disclosed transformer monitoring unit is configured to maintain physical separation between a primary current-sensing cable assembly and a secondary current-sensing cable assembly when the transformer monitoring unit and its attached cable assemblies are mounted in a retrofit manner to a transformer in the field.

Figure 1:
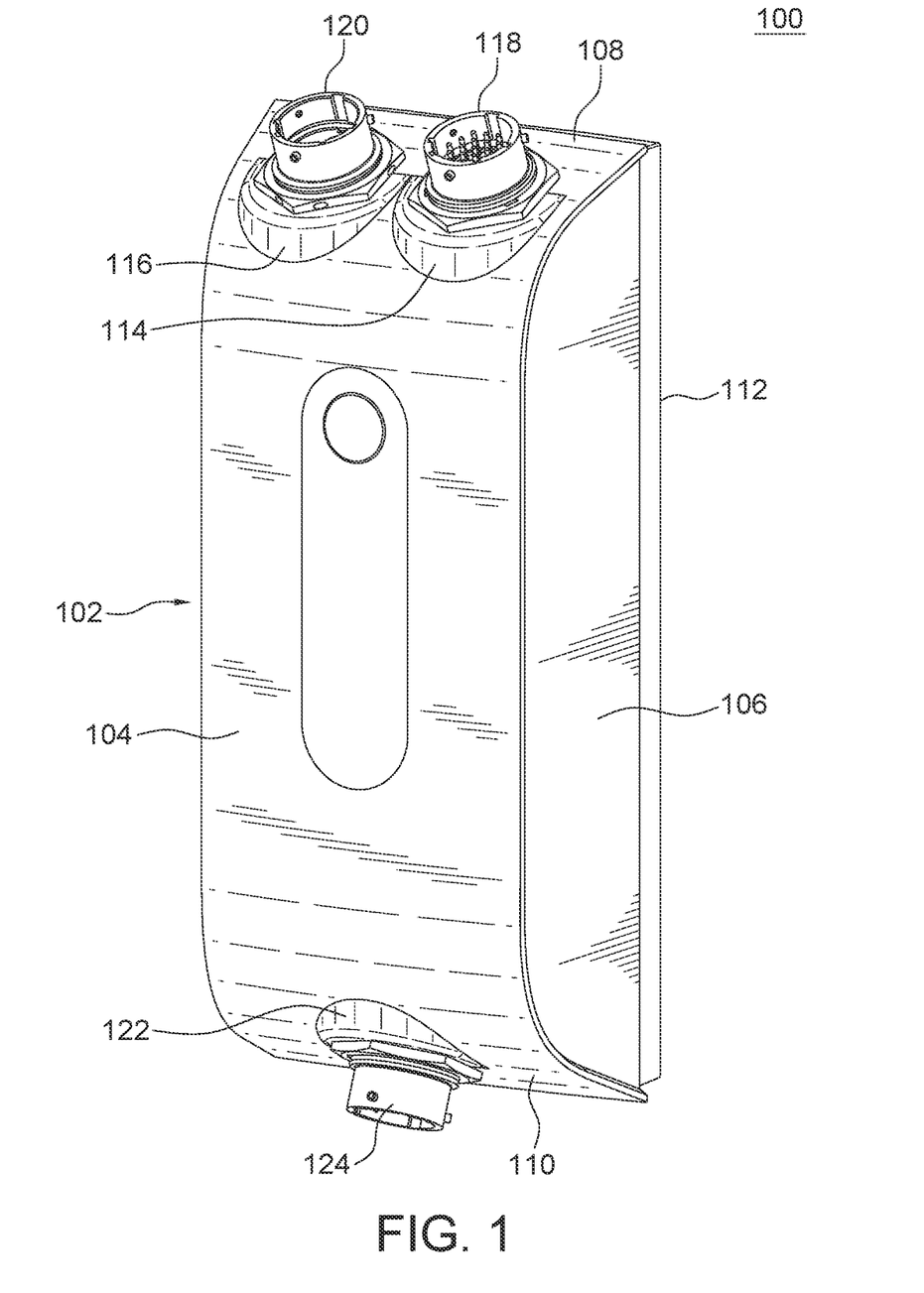
FIG. 1 is a front side perspective view of a transformer monitoring unit in accordance with an exemplary embodiment of the present disclosure.

FIG. 1 is a front side perspective view of a transformer monitoring apparatus or unit 100 in accordance with some exemplary embodiments of the present disclosure. The transformer monitoring unit 100 is usable to monitor a single-phase or a three-phase transformer and includes a housing 102 that is generally cuboid in shape, having a front side 104, lateral sides 106, and a back side 300 (shown in FIG. 3). In the exemplary orientation shown in FIG. 1, the housing 102 is elongated in the vertical direction, although need not be. The housing 102 has a first end 110 and a second end 108 at generally opposite lengthwise ends of the housing 102. Alternatively, the generally opposing ends of the housing 102 may be along the lateral sides 106 of the housing 102 (e.g., widthwise) or at generally opposite faces of a faceted housing. In the embodiment depicted in FIG. 1, a distance between the first and second ends 108, 110 is greater than the width of the housing 102, which is in the horizontal direction as shown in FIG. 1. The front side 104 of the housing 102 is generally flat along a vertical plane and becomes rounded towards each of the first and second ends 108, 110 towards the rear or back of the transformer monitoring unit 100 where a base 112 is mounted or included.

A first connector 124 is positioned on the front side 104 of the housing 102 proximate the first end 110 of the housing 102. The first connector 124 may have a metal connector component that includes a cylindrical ground portion surrounding several signal conductors, and which extends outwardly from the front side 104 of the housing 102. The first connector 124 may be supported by a boss or lip 122 formed proximate the first end 110 of the housing 102. The first connector 124 may be a multi-pin coaxial connector configured for connection to a cable assembly that outputs signals representative of at least one primary input current to a transformer being monitored. The cable assembly may include one or more Rogowski coils or current transformers for sensing current at the primary side of the transformer. The cable assembly may include two or more Rogowski coils or current transformers for sensing at least two input currents at the primary side of the transformer when the transformer is a three-phase transformer.

Similarly, a second connector 118 is positioned on the front side 104 of the housing 102 proximate the second end 108 of the housing 102. The second connector 118 may have a metal connector component that includes a cylindrical ground portion surrounding several signal conductors, and which extends outwardly from the front side 104 of the housing 102. The second connector 118 may be supported by a boss or lip 114 formed proximate the second end 108 of the housing 102. The second connector 118 may be a multi-pin coaxial connector configured for connection to a cable assembly that outputs signals representative of at least one secondary output current of a transformer being monitored. The cable assembly may include one or more Rogowski coils or current transformers for sensing current at the secondary side of the transformer. Where the transformer includes multiple secondary outputs, the cable assembly may include two or more Rogowski coils or current transformers for sensing the multiple output currents supplied by the secondary side of the transformer.

The monitoring unit 100 may optionally include a third connector 120 positioned on the front side 104 or along a lateral wall 106 of the housing 102. According to one embodiment, the third connector 120 may be positioned proximate the second end 108 of the housing 102, as illustrated in FIG. 1. When positioned proximate the second end 108 of the housing 102, the third connector 120 may be oriented to be substantially parallel to the second connector 118. The third connector 120 may be supported by a boss or lip 114 formed at its position on the housing 102. When included, the third connector may be configured for connection to a third cable assembly that outputs AC power for use by the monitoring unit 100. In a preferred embodiment, the AC power supplied through the third connector 120 is supplied at the voltage level at the secondary side of the transformer (e.g., 120 VAC) and thereby permits sensing of such voltage by the monitoring unit 100 in accordance with known voltage sensing techniques. Each connector 118, 120, 124 may include mechanical elements or features to permit secure connection to a mating connector of a cable assembly, such as, for example, one or more lugs, nubs, or posts that extend perpendicularly outward from the connector component or external or internal threads.

Figure 2:
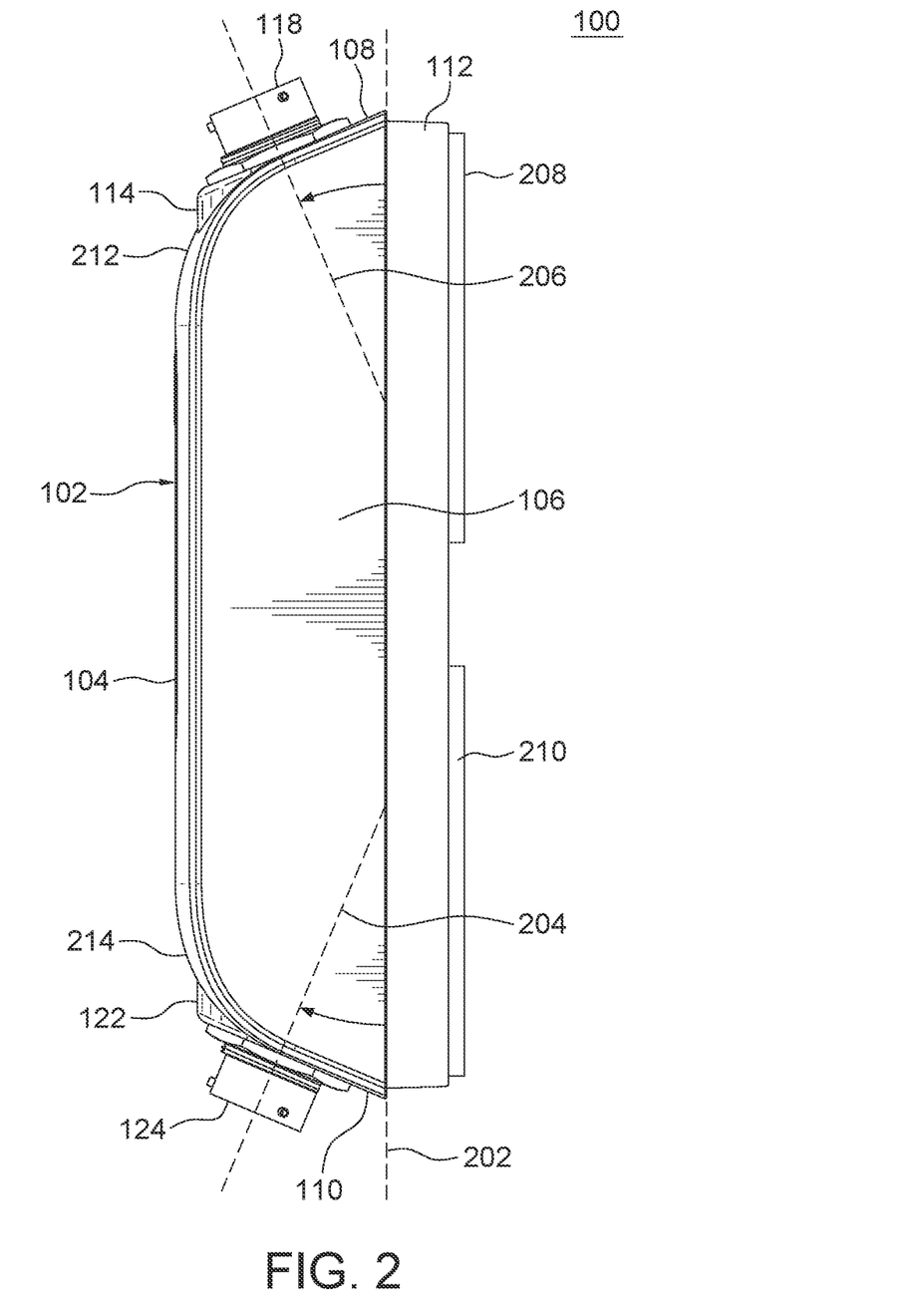
FIG. 2 is a side elevational view of the transformer monitoring unit of FIG. 1.

FIG. 2 is a side elevational view of the exemplary transformer monitoring unit 100 as viewed looking toward the right lateral side 106. This view shows that the surface of the front side 104 rounds off or tapers as it approaches the first and second ends 108, 110 of the housing 102 and includes rounded corner portions 212, 214, respectively. As shown in FIG. 2, the ends 108, 110 of the housing 102 define a plane along line 202. Each of the first and second connectors 118, 124 extend from the front side 104 of the housing 102 proximate a respective end 108, 110 and along a respective axis 204, 208. In this embodiment, the third connector 120 is parallel to the second connector 118 and, therefore, not shown in the side view of FIG. 2. Axis 204 and axis 206, indicating the orientations of the first and second (and third) connectors 118, 124, illustrate that the connectors 118, 124 may be oriented so as to be at a non-zero angle relative to reference plane 202. In general, the angles of orientation of the first and second connectors 118, 124 are such that the first and second connectors 124, 118 are generally oriented in opposing directions, but less than one hundred eighty degrees with respect to each other. In some exemplary embodiments, the angle between reference plane 202 and each axis 204, 206 may be forty-five degrees or less. Thus, the terms "generally opposite," "substantially opposite," "generally opposite direction(s)," "generally opposite orientation(s)," "substantially opposite direction(s)," and "substantially opposite orientation(s)," mean an angle between axis 204 and axis 206 that is greater than or equal to ninety degrees. In the embodiment illustrated in FIG. 2, the angle between axis 204 and axis 206 is approximately one hundred thirty degrees.

By orienting the first and second connectors 118, 124 in such a manner, cables of the cable assemblies connected to these connectors 118, 124 extend away from the connectors 124, 118 and the front side 104 of the housing 102 in generally opposing directions, providing clearance for an operator to connect or remove the cables and mitigating the likelihood that such cables will be crossed during use. Forcing the cables to extend away from each other helps to ensure that the primary and secondary side sensing cables are separated, thereby mitigating the likelihood of an electric field generated around either cable negatively affecting the other. In some embodiments, the housing 102 can extend forward sufficiently such that the first and second connectors 118, 124 can be oriented in directly opposite directions, at one hundred eighty degrees relative to each other.

On the back side of the monitoring unit 100, a base 112 may be attached or form part of the housing 102. The base 112 may extend from the reference plane 202 and facilitate mounting of the monitoring unit 100 to a transformer surface. In some embodiments, magnets 208, 210 may be included on the back side of the housing 102 and extend beyond the edge of the base 112 to magnetically engage the transformer surface, which is typically made of a ferrous metal. As a result, the magnets 208, 210 may hold the transformer monitoring unit 100 in place during use.

Figure 3:
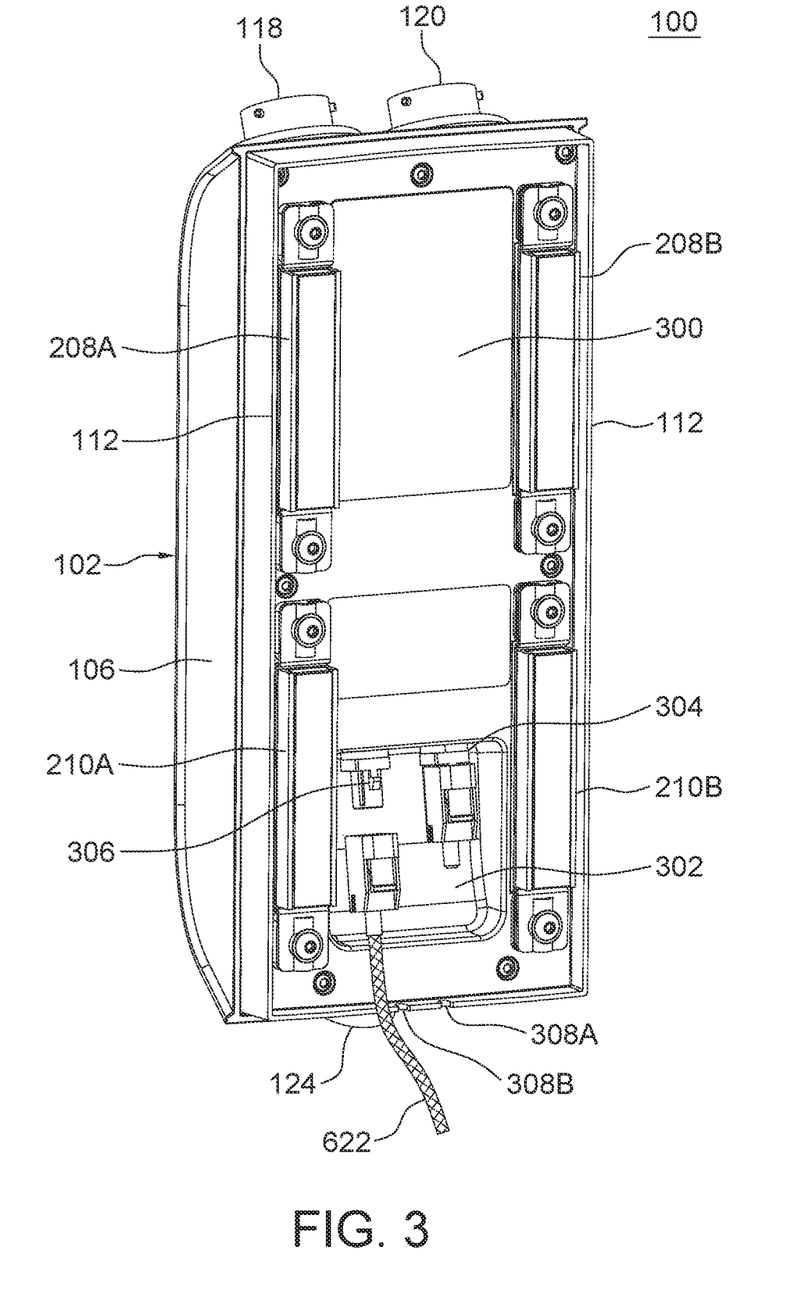
FIG. 3 is a back side perspective view of the transformer monitoring unit of FIG. 1.

FIG. 3 is a back side perspective view of the exemplary transformer monitoring unit 100. As shown in this view, the base 112 may form a wall around a perimeter of the back side 300 of the transformer monitoring unit 100. Magnets 208A, 208B, 210A, 210B may be positioned generally along the lengthwise sides of the back side 300 of the housing 102. A recess or cavity 302 may be formed into the back side 300 of the housing 102 to provide a space in which an antenna connector 304 and a pressure sensor connector 306 may be included. When included, the antenna connector 304 connects a radio module of the monitoring unit 100 to an external antenna via an antenna cable to allow the transformer monitoring unit 100 to communicate with a remote station. The radio module may be, for example, a cellular data unit that is capable of connecting to a cellular communications infrastructure. When included, the pressure sensor connector 306 connects to a pressure sensor via a pressure sensor cable 622, and the pressure sensor provides an electrical signal that indicates the pressure inside the oil tank of the transformer. To allow the cables to exit the base 112, the wall of the base 112 defines a pair of cutouts 308A, 308B or notches to allow the antenna cable (not shown) and the pressure sensor cable 622 to pass to the antenna connector 304 and the pressure sensor connector 306, respectively, when the transformer monitoring unit 100 is mounted to a transformer.

Figure 4:
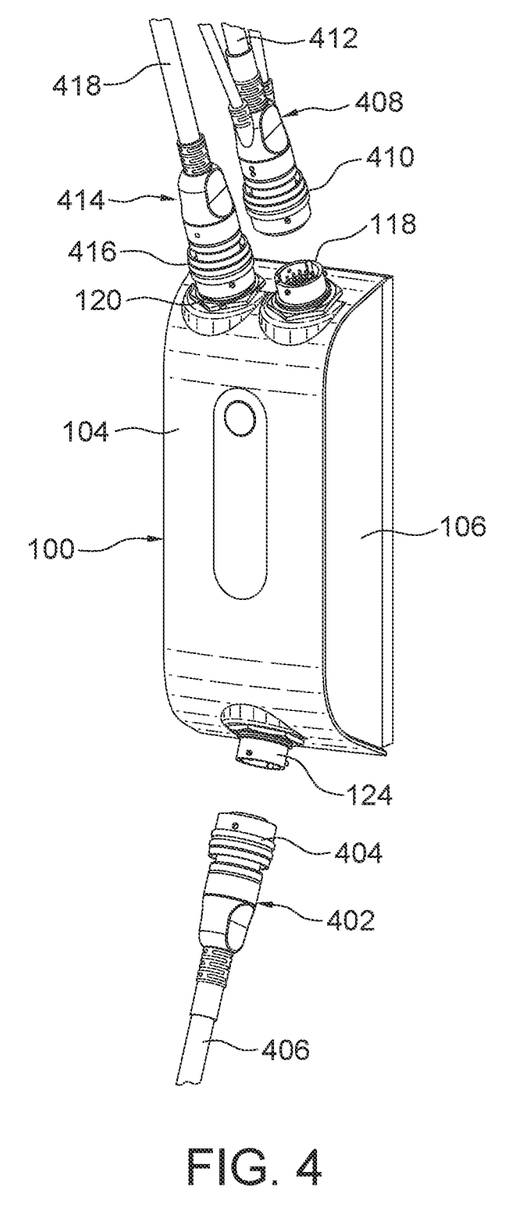
FIG. 4 is a front side perspective view of the transformer monitoring unit of FIG. 1 showing connection details between cable assemblies and connectors of the transformer monitoring unit, in accordance with exemplary embodiments of the present disclosure.

FIG. 4 is a front side perspective view of the exemplary transformer monitoring unit 100 showing connection details between cable assemblies and the connectors 118, 120, 124 of the transformer monitoring unit 100. For example, a primary side current sensing cable assembly 402 may connect to the first connector 124, a secondary side current sensing cable assembly 408 may connect to the second connector 118, and a power cable assembly 414 may connect to the third connector 120, when such third connector 120 is included. The primary current sensing cable assembly 402 may include a cable connector 404, which mates with the first connector 124 of the transformer monitoring unit 100, and a single conductor or multi-conductor cable 406 that connects to one more Rogowski coils or current transformers for sensing current at the primary side of the transformer. Similarly, the secondary current sensing cable assembly 408 may include a cable connector 410, which mates with the second connector 118 of the transformer monitoring unit 100, and a single conductor or multi-conductor cable 412 that is connected to one or more Rogowski coils or current transformers for sensing current at one or more secondary sides of the transformer. When used, the power cable assembly 414 includes a cable connector 416, which mates with the third connector 120 of the transformer monitoring unit 100, and a single conductor or multi-conductor cable 418 for connecting to the secondary side of the transformer and providing power to the transformer monitoring unit 100. The connectors 404, 410, 416 of the cable assemblies 402, 408, 414 may be Bayonet Neill-Concelman (BNC) type coaxial connectors that include grooves or slots, which engage respective lugs on complementary BNC connectors 118, 120, 124 of the transformer monitoring unit 100. As illustrated in FIG. 4, the first connector 124 of the transformer monitoring unit 100 orients the primary current sensing cable assembly 402 such that the cable 406 of the assembly 402 extends in a direction generally opposite from that of the cable 412 of the secondary current sensing cable assembly 408 (and the power cable 418) when the connector 410 of the secondary current sensing cable assembly 408 is connected to the second connector 118 of the transformer monitoring unit 100. Such an arrangement helps prevent the primary and secondary current sensing cables 406, 412 from crossing, overlapping, or otherwise being in close proximity to each other.

Figure 5:
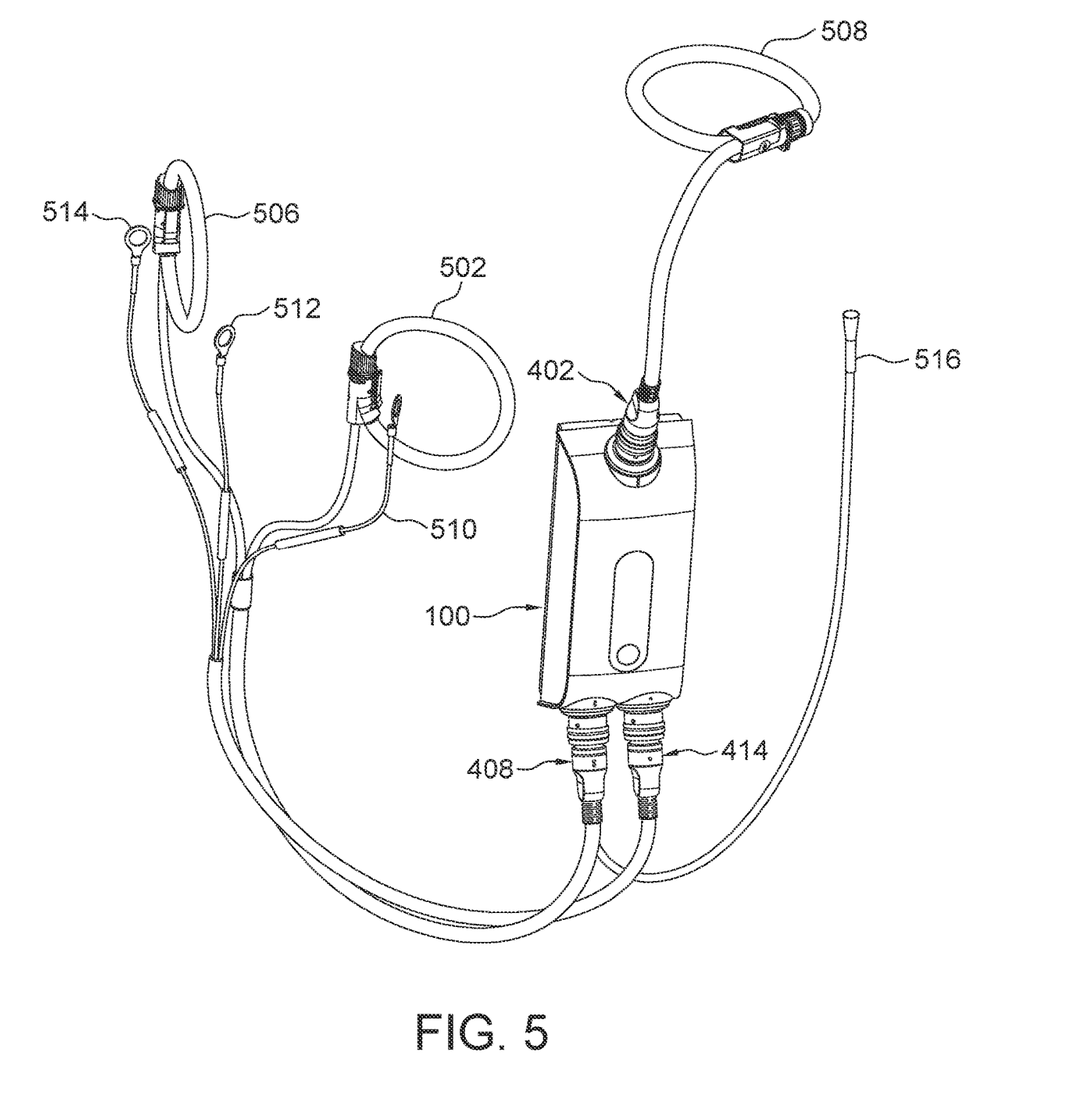
FIG. 5 is a front perspective view of the transformer monitoring unit of FIG. 1 as connected to various cable assemblies for use in monitoring an aerial pole-mounted transformer, in accordance with additional exemplary embodiments of the present disclosure.

FIG. 5 is a front perspective view of the exemplary transformer monitoring unit 100 as connected to various cable assemblies for use in monitoring an aerial pole-mounted transformer. In general, the transformer monitoring unit 100 can be used for monitoring aerial and pad mounted transformers. In FIG. 5, the transformer monitoring unit 100 is shown inverted relative to how it is shown in FIGS. 1-4. This orientation may be selected when the primary bushing(s) of the transformer is located at a higher position than the secondary bushing(s) of the transformer. In this embodiment, the primary current sensing cable assembly 402 includes or is connected to at least one Rogowski coil 508 (one shown) or current transformer that will be disposed around a bushing or other input on the primary side of the transformer. When positioned around a conductor, a Rogowski coil outputs a signal representative of an electric current passing through the conductor by electromagnetic coupling to the magnetic field produced by such current. Thus, Rogowski coil 508 is positioned around a conductor passing into the primary side of the transformer and generates output signals representative of the primary input current to the transformer (e.g., voltage signals that are proportional to such current over time). Similarly, the secondary current sensing cable assembly 408 includes or is connected to two Rogowski coils 502, 506 in this embodiment, which are each positioned around a respective conductor on the secondary side of the transformer and output signals representative of the secondary output currents of the transformer. When used, power cable assembly 414 includes three terminals 510, 512, 514, which are each connected to different voltage lines out of the secondary side of the transformer (e.g., hot, neutral, ground) to provide power to the transformer monitoring unit 100. A pressure sensor cable 516 may be connected to the pressure sensor connector 306 on the back side 300 of the monitoring unit's housing 102, and to a pressure sensor connected to a pressure sensor output of the transformer.

Figure 6:
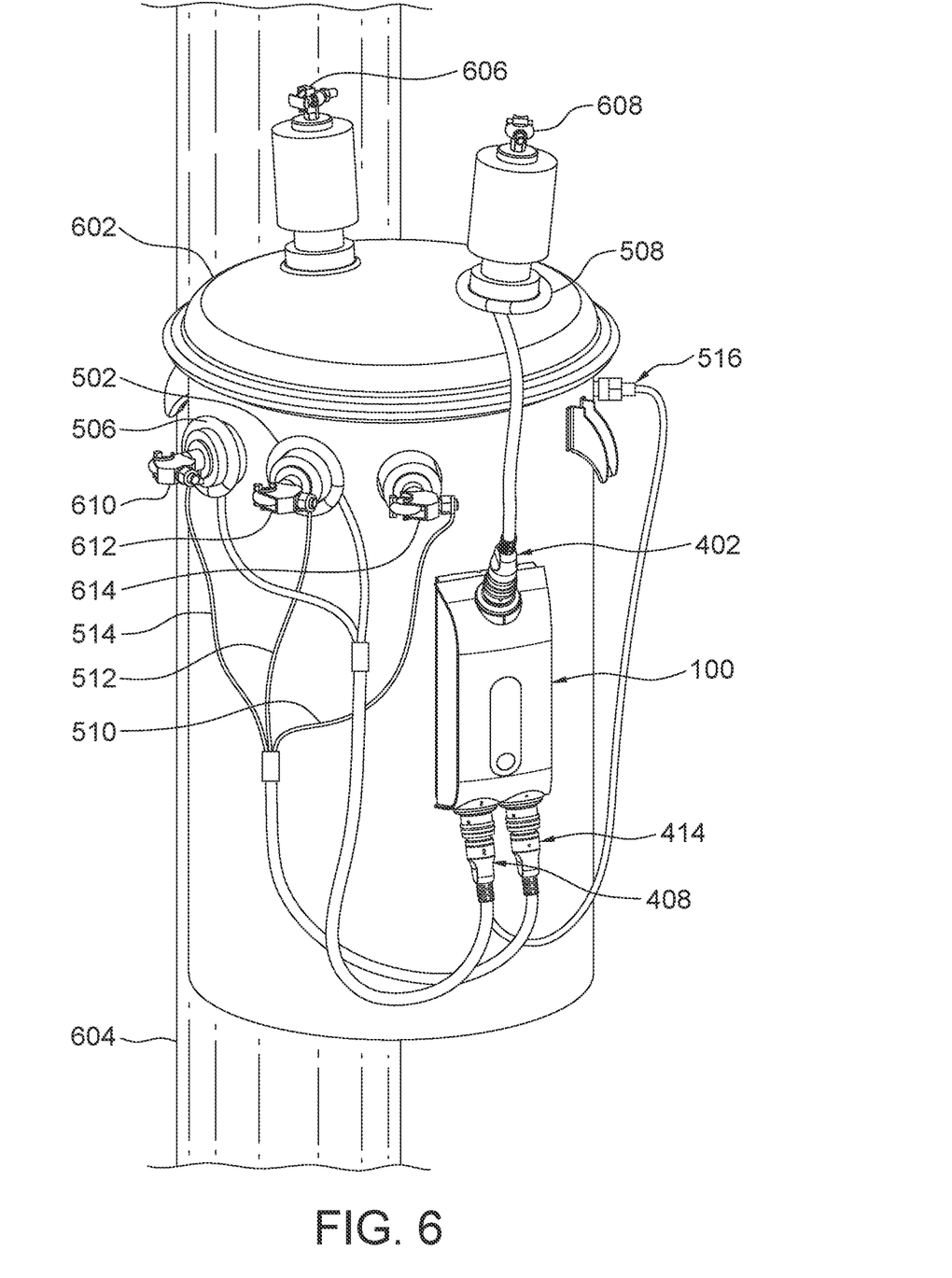
FIG. 6 illustrates a use case of the transformer monitoring unit of FIG. 1 as mounted to an aerial distribution transformer, in accordance with further exemplary embodiments of the present disclosure.

FIG. 6 illustrates a use case of the exemplary transformer monitoring unit 100 as mounted to an aerial distribution transformer 602. A pole 604 is typically used to suspend high voltage distribution lines above the ground, and the distribution transformer 602 is used to step down the voltage level from the primary distribution voltage level (e.g., 10 kV) to a service level (e.g., 110-480 V) that is provided to residences and businesses. The distribution lines are connected to the primary inputs 606, 608 of the transformer 602 and stepped down by the transformer 602 to provide service level voltages at the secondary outputs 610, 612 of the transformer 602. The transformer monitoring unit 100 is substantially identical to that shown in FIG. 5. The primary side Rogowski coil 508 is shown positioned around one of the primary side conductors (e.g., conductor bushing) 608 sourcing current into the transformer 602. On the secondary side, Rogowski coils 502, 506 are positioned around secondary conductors (e.g., conductor bushings) 610, 612. Power cable conductors 510, 512, 514 may be connected to the secondary conductors 610, 612, 614. Pressure sensor cable 516 may be connected to a pressure sensor attached to a pressure sensor output of the transformer 602. The arrangement shown in FIG. 6 allows the transformer monitoring unit 100 to sense and measure current at the primary and secondary sides of the transformer 602, as well as to monitor the secondary output voltages of the transformer 602 and the pressure inside the oil tank of the transformer 602. In a further exemplary embodiment, the transformer monitoring unit 100 may include communication circuitry to enable the transformer monitoring unit 100 to communicate monitored parameter data to a remote computing system. The transformer monitoring unit 100 is shown mounted on the outside wall of the transformer 602 and the configuration of the transformer monitoring unit 100 and its connectors 118, 120, 124, with primary and secondary side connectors 118, 124 located proximate opposite ends of the monitoring unit's housing 102 maintains physical separation between the cables 406, 412 of the primary and secondary current sensing cable assemblies 402, 408.

Figure 7:
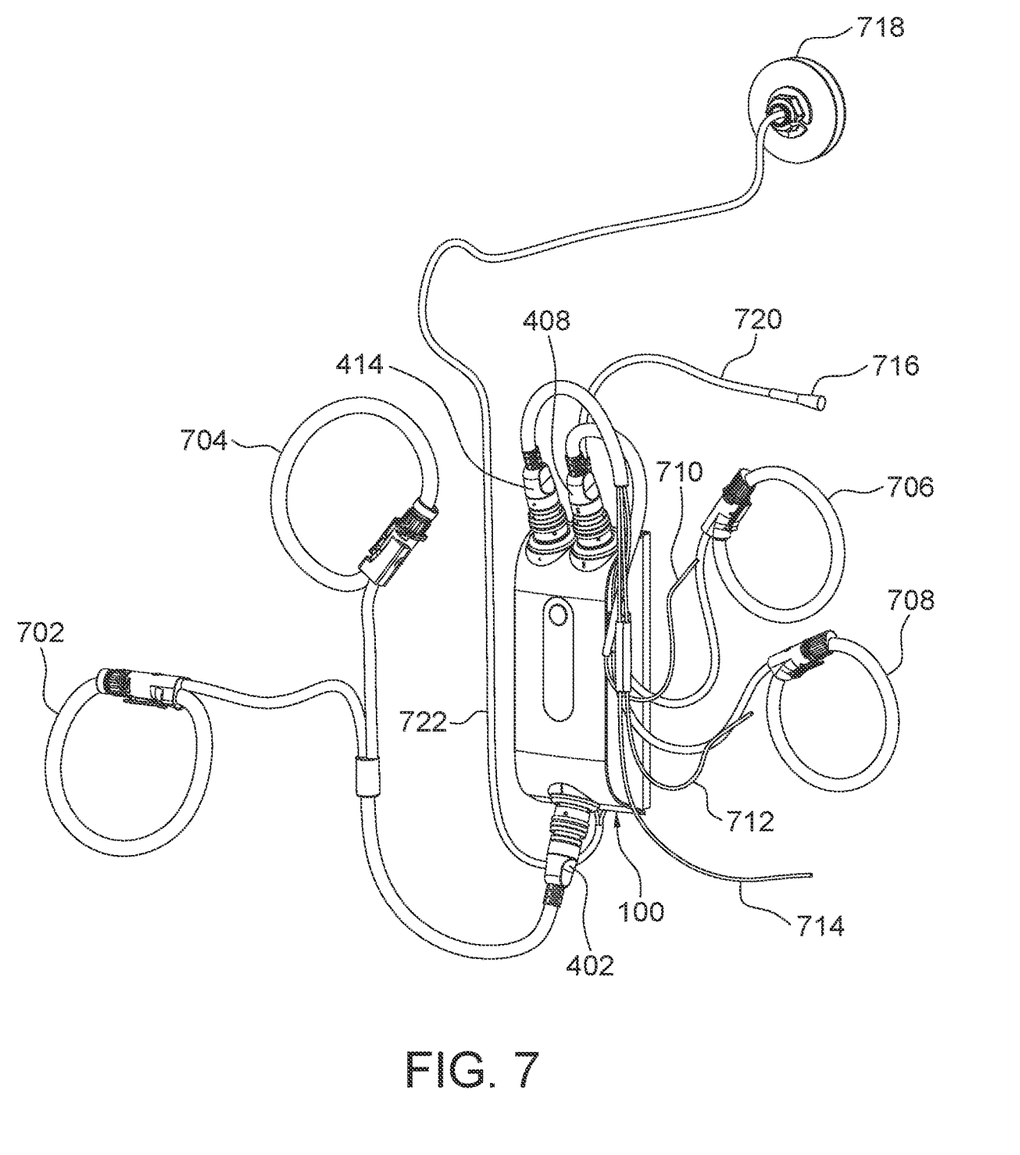
FIG. 7 is a front perspective view of the transformer monitoring unit of FIG. 1 as connected to various cable assemblies for use in monitoring a pad mounted transformer, in accordance with further exemplary embodiments of the present disclosure.

FIG. 7 is a front perspective view of the exemplary transformer monitoring unit 100 as connected to various cable assemblies for use in monitoring a pad mounted distribution transformer. As shown in the figure, the transformer monitoring unit 100 is oriented as shown in FIGS. 1-4, with the first connector 124 at the bottom and the second connector 118 at the top. As described above, the first and second connectors 118, 124 may be multi-pin connectors allowing for different numbers of input signal lines. Accordingly, in the configuration shown in FIG. 7, the primary current sensing cable assembly 402 includes or is attached two Rogowski coils 702, 704 or current transformers and the secondary current sensing cable assembly 408 also includes or is attached to two Rogowski coils 706, 708 or current transformers. The power cable assembly 414 includes conductors 710, 712, 714 for connecting to the conductors of the secondary side of the transformer. A pressure sensor coupling 716 is configured to connect the pressure sensor cable 720 to a pressure sensor in the transformer. A pressure sensor cable 720 is further coupled to the pressure sensor connector 306 on the back side 300 of the transformer monitoring unit's housing 102. An antenna coupling 718 is connected to the transformer monitoring unit 100 via an antenna cable 722, which is connected to the antenna connector 304 on the back side 300 of the transformer monitoring unit's housing 102.

Figure 8:
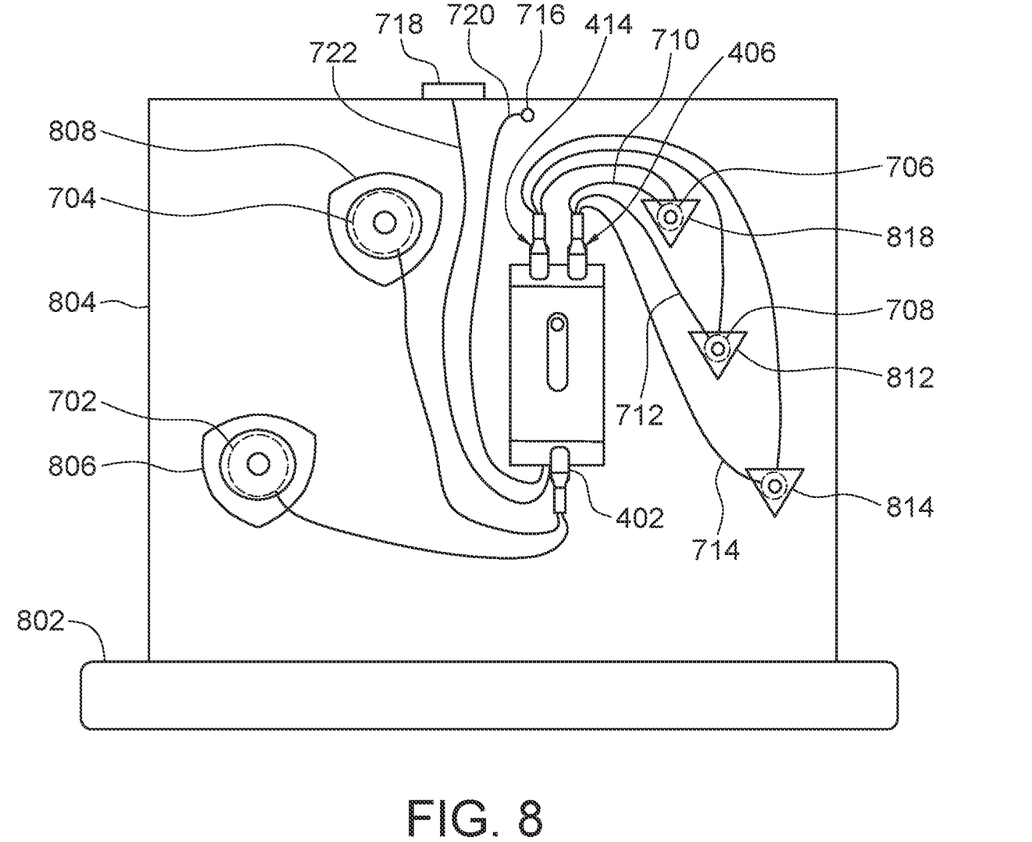
FIG. 8 illustrates a use case of the transformer monitoring unit of FIG. 1 as mounted to a pad mounted distribution transformer, in accordance with further exemplary embodiments of the present disclosure.

FIG. 8 illustrates a use case of the exemplary transformer monitoring unit 100 as mounted to a pad mounted distribution transformer 804. The pad mounted transformer 804 may be mounted on a concrete pad or slab 802. The transformer 804 illustrated in FIG. 8 is shown with its front or hatch door removed for clarity. The hatch door would be included to keep the conductors (bushings) protected from environmental conditions and isolated from contact by unauthorized personnel.

In this embodiment, the transformer monitoring unit 100 may be secured to the wall separating the transformer tank from the transformer hatch. The transformer monitoring unit 100 is substantially identical to that shown in FIG. 7. The primary side conductors (bushings) 806, 808 receive the distribution voltage, which is stepped down to service voltage levels at the secondary conductors (bushings) 812, 814, 818. To sense and measure primary input current to one primary side conductor 806 and primary output from another primary side conductor 808 (e.g., to pass the primary distribution line to the primary input of another pad mounted distribution transformer), two Rogowski coils 702, 704 or current transformers are coupled around the primary conductors 806, 808 and connected to the transformer monitoring unit 100 by the primary current sensing cable assembly 402. To sense and measure secondary output currents from secondary side conductors 812, 818, two Rogowski coils 706, 708 or current transformers are positioned around the secondary conductors 818, 812 and connected to the transformer monitoring unit 100 by the secondary current sensing cable assembly 406. Power conductors 710, 712, 714 are coupled to the secondary conductors 818, 812, 814 and connected to the transformer monitoring unit 100 by the power cable assembly 414. Pressure sensor 716 is connected to the pressure sensor connector 306 of the transformer monitoring unit 100 via a pressure sensor cable 720, and an external antenna 718 is coupled to the antenna connector 304 of the transformer monitoring unit 100 via an antenna cable 722.

The arrangement shown in FIG. 8 allows the transformer monitoring unit 100 to sense and measure current at the primary and secondary sides of the transformer 804, as well as to monitor the secondary output voltages of the transformer 804 and the pressure inside the oil tank of the transformer 804. In a further exemplary embodiment, the transformer monitoring unit 100 may include communication circuitry to enable the transformer monitoring unit 100 to communicate monitored parameter data to a remote computing system.

As illustrated in FIGS. 7 and 8, the first connector 124 of the transformer monitoring unit 100 orients the primary current sensing cable assembly 402 such that the cable 406 of the assembly 402 extends in a direction generally opposite from the direction of the cable 412 of the secondary current sensing cable assembly 408 when the connector 410 of the secondary current sensing cable assembly 408 is connected to the second connector 118 of the transformer monitoring unit 100. Such an arrangement helps prevent the primary and secondary current sensing cables 406, 412 from crossing, overlapping, or otherwise being in close proximity to each other, thereby mitigating errors in primary and/or secondary current values determined by the transformer monitoring unit 100.

The claims appended hereto are meant to cover all modifications and changes within the scope and spirit of the present disclosure.

What is claimed is:

1. A monitoring apparatus for a transformer, the monitoring apparatus comprising:
    a housing having a first end and a second end, wherein the second end is substantially opposite the first end;
    a first connector positioned proximate the first end of the housing, the first connector being configured for connection to a first cable assembly that outputs signals representative of at least one primary input current to the transformer; and
    a second connector positioned proximate the second end of the housing, the second connector being configured for connection to a second cable assembly that outputs signals representative of at least one secondary output current of the transformer;
    wherein the first connector and the second connector are oriented such that the first cable assembly extends away from the first end of housing in a first direction when the first cable assembly is connected to the first connector and the second cable assembly extends away from the second end of the housing in a second direction when the second cable assembly is connected to the second connector, and wherein the first direction and the second direction are generally opposite directions.

2. The monitoring apparatus of claim 1, wherein:
    the first connector is oriented at an angle of not more than forty-five degrees relative to a reference plane running a length of the housing; and
    the second connector is oriented at an angle of not less than one hundred thirty-five degrees relative to the reference plane.

3. The monitoring apparatus of claim 1, wherein:
    the second connector is oriented at an angle of not more than forty-five degrees relative to a reference plane running a length of the housing; and
    the first connector is oriented at an angle of not less than one hundred thirty-five degrees relative to the reference plane.

4. The monitoring apparatus of claim 1, wherein the first connector and the second connector are oriented so as to be at an angle in a range of about ninety degrees to about one hundred eighty degrees relative to each other.

5. The monitoring apparatus of claim 1, wherein each of the first connector and the second connector includes a respective connector component that extends outward from the housing.

6. The monitoring apparatus of claim 1, wherein the housing includes a base on a back side thereof, wherein the base defines a cavity, and wherein the monitoring apparatus further comprises:
    a pressure sensor connector positioned in the cavity; and
    an antenna connector positioned in the cavity.

7. The monitoring apparatus of claim 6, wherein a wall of the base defines at least two cutouts to allow for passage of an antenna cable to the antenna connector and a pressure sensor cable to the pressure sensor connector.

8. The monitoring apparatus of claim 1, wherein the first cable assembly outputs signals representative of at least two primary input currents to the transformer.

9. The monitoring apparatus of claim 1, wherein the second cable assembly outputs signals representative of at least two secondary output currents of the transformer.

10. The monitoring apparatus of claim 1, further comprising:
    a third connector positioned proximate the second end of the housing, the third connector being configured for connection to a third cable assembly that outputs alternating current power for use by the monitoring apparatus.

11. The monitoring apparatus of claim 10, wherein the third connector is oriented substantially parallel to the second connector.

12. The monitoring apparatus of claim 1, wherein the first connector and the second connector are coaxial connectors.

13. The monitoring apparatus of claim 1, wherein the housing has a front side and a back side and wherein the first connector and the second connector are positioned on the front side of the housing.

14. The monitoring apparatus of claim 1, wherein the first end of the housing is a first lengthwise end of the housing and wherein the second end of the housing is a second lengthwise end of the housing.

15. A monitoring apparatus for a transformer, the monitoring apparatus comprising:
    a housing having a front side, a back side, a first lengthwise end, and a second lengthwise end, the second lengthwise end being substantially opposite the first lengthwise end;
    a first connector positioned on the front side of the housing proximate the first lengthwise end, the first connector being configured for connection to a first cable assembly that outputs signals representative of at least one primary input current to the transformer; and
    a second connector positioned on the front side of the housing proximate the second lengthwise end, the second connector being configured for connection to a second cable assembly that outputs signals representative of at least one secondary output current of the transformer; and
    a third connector positioned on the front side of the housing proximate the second lengthwise end, the third connector being configured for connection to a third cable assembly that outputs alternating current power for use by the monitoring apparatus;
    wherein the first connector and the second connector are oriented such that the first cable assembly extends away from the first end of housing in a first direction when the first cable assembly is connected to the first connector, the second cable assembly extends away from the second end of the housing in a second direction when the second cable assembly is connected to the second connector, and the first connector and the second connector are oriented so as to be at an angle in a range of about ninety degrees to about one hundred eighty degrees relative to each other.

16. The monitoring apparatus of claim 15, wherein each of the first connector and the second connector includes a respective connector component that extends outward from the front side of the housing.

17. The monitoring apparatus of claim 15, wherein the housing includes a base on the back side thereof, wherein the base defines a cavity, and wherein the monitoring apparatus further comprises:
- a pressure sensor connector positioned in the cavity; and
- an antenna connector positioned in the cavity.

18. The monitoring apparatus of claim 17, wherein a wall of the base defines at least two cutouts to allow for passage of an antenna cable to the antenna connector and a pressure sensor cable to the pressure sensor connector.

19. The monitoring apparatus of claim 15, wherein the first cable assembly outputs signals representative of at least two primary input currents to the transformer.

20. The monitoring apparatus of claim 15, wherein the second cable assembly outputs signals representative of at least two secondary output currents of the transformer.

\* \* \* \* \*